United States Patent [19]

Araki

[11] Patent Number: 5,396,795
[45] Date of Patent: Mar. 14, 1995

[54] SEMICONDUCTOR SENSOR DEVICE FOR MEASURING INTAKE FLOW RATE

[75] Inventor: Toru Araki, Itami, Japan

[73] Assignee: Mitsubishi Denki Kabushiki Kaisha, Tokyo, Japan

[21] Appl. No.: 980,695

[22] Filed: Nov. 24, 1992

[30] Foreign Application Priority Data

Dec. 9, 1991 [JP] Japan .................. 3-324319

[51] Int. Cl.$^6$ .............................. G01F 1/68
[52] U.S. Cl. ........................... 73/204.26
[58] Field of Search ........... 73/204.26, 204.25, 204.23;
257/167, 467, 470, 414

[56] References Cited

U.S. PATENT DOCUMENTS

| | | |
|---|---|---|
| 4,517,837 | 5/1985 | Oyama et al. . |
| 4,705,713 | 11/1987 | Ohta et al. . |
| 4,884,443 | 12/1989 | Lee et al. . |
| 4,888,988 | 12/1989 | Lee et al. .......................... 73/204.26 |
| 4,986,122 | 1/1991 | Gust . |
| 5,231,878 | 8/1993 | Zanini-Fisher et al. ......... 73/204.26 |

FOREIGN PATENT DOCUMENTS

| | | |
|---|---|---|
| 3101191 | 12/1981 | Germany . |
| 4025644 | 3/1991 | Germany . |
| 4116321 | 11/1991 | Germany . |
| 2-264822 | 10/1990 | Japan .............................. 73/204.26 |

Primary Examiner—Richard E. Chilcot, Jr.
Assistant Examiner—Harshad Patel
Attorney, Agent, or Firm—Oblon, Spivak, McClelland, Maier & Neustadt

[57] ABSTRACT

The semiconductor flow rate detector comprises a semiconductor chip having sensor elements on its surface, leads connected to connecting terminals of the semiconductor chip, and a resin base covering junctions between the leads and the connecting terminals of the semiconductor chip and integrally holding them.

9 Claims, 8 Drawing Sheets

SEMICONDUCTOR SENSOR DEVICE FOR MEASURING INTAKE FLOW RATE

BACKGROUND OF THE INVENTION

1. Field of the Invention

The present invention relates to a semiconductor sensor device such as a semiconductor flow rate detector used for measuring the intake air flow of automobile engines and a method of fabricating the same.

2. Description of the Background Art

Description will be given on a semiconductor flow rate detector as an example of conventional semiconductor sensor devices.

FIG. 8A is a plan view of the conventional semiconductor flow rate detector, and FIG. 8B is a vertical sectional view taken along the line I—I of FIG. 8A.

With reference to FIGS. 8A and 8B, a semiconductor flow rate detector 1 includes a semiconductor chip 2 formed with a heater element 4 and a temperature-sensitive element 5 on a wafer such as silicon, a metal frame 3 for holding the semiconductor chip 2, leads 1 connected respectively to connecting terminals 2a of the semiconductor chip 2 through wires 6, and a base 8 made of resin for securely holding the frame 3 and leads 7.

The semiconductor flow rate detector 1 is installed in a fluid passageway such that a fluid, the flow rate of which is to be detected, flows in the direction of the arrow II of FIG. 8A.

FIG. 9 is a diagram of a circuit for measuring the flow rate of fluid by means of the semiconductor flow rate detector 1. Referring to FIG. 9, the operations of flow rate detection will be described hereinafter.

The heater element 4 has a positive coefficient whose internal resistance $R_H$ increases as the temperature rises. A resistive element 9 having a resistance $R_M$ is connected to the heater element 4 in series. The internal resistance of the resistive element 9 is unaffected by the temperature changes (i.e. has no temperature coefficient). A voltage V0 is applied across the elements 4 and 9.

A proportional value K is calculated from a potential V1 at a node (a) of the heater element 4 and resistive element 9 and the applied voltage V0 by the following expression:

$$K = V1/V0 = R_M/(R_M + R_H)$$

The heater element 4, which is disposed in the fluid passageway as above mentioned, transfers heat to the fluid, so that the temperature of the heater element 4 falls. As a result, the internal resistance $R_H$ of the heater element 4 decreases, and the proportional value K increases.

A comparator 10 compares the proportional value K calculated from the constantly detected voltage V1 with a predetermined constant K1 to send the comparison results to a voltage controller 11. The voltage controller 11 controls the voltage V0 applied to the heater element 4 as a function of the comparison results. For example, when the temperature of the heater element 4 falls resulting in K>K1, the control described below is carried out. The voltage V0 is increased to increase a current flow in the heater element 4. The heat generated by the heater element 4 supplements the quantity of heat taken away by the fluid, whereby the internal resistance $R_H$ is returned to the initial value to achieve K=K1.

The quantity of heat transferred from the heater element 4 to the fluid is proportional to the flow rate of the fluid. A current detector 12 detects the quantity of current increased by the feedback control described above, and an operation unit 13 calculates the flow rate as a function of the current increment. The flow rate is displayed by a display unit 14.

When there is a difference between the fluid temperature and the temperature of the heater element 4 where the fluid flow stops and the flow rate is zero, the temperature of the heater element 4 falls and the situation is as if there were a practical fluid flow. In this case, the temperature-sensitive element 5 measures the fluid temperature to send a temperature signal to the operation unit 13. The correction is made such that the flow rate calculated by the operation unit 13 becomes zero.

In the conventional semiconductor flow rate detector 1 having such a structure, since the semiconductor chip 2 is securely held by the metal frame 3, the frame 3 conducts heat to other portions and the quantity of heat is taken away. This causes measurement errors and deteriorating detection accuracy. Another disadvantage is that an increasing heat capacity of the whole semiconductor flow rate detector 1 causes extremely slow responses when the flow rate of the fluid to be measured abruptly changes.

In addition, the wires 6 and leads 7 are exposed to the fluid. This causes the problems that the wires 6 are cut at a large flow rate and that bonding portions of the wires 6 are damaged. The reliability of measurement is therefore not sufficiently accurate.

SUMMARY OF THE INVENTION

According to the present invention, a semiconductor sensor device comprises a semiconductor chip including on its surface a sensor element and a connecting terminal connected to the sensor element; a lead connected to the connecting terminal; and a base for covering only a junction between the connecting terminal and the lead with the sensor element exposed and integrally holding the semiconductor chip and the lead.

In the semiconductor sensor device according to the invention, since the junction between the semiconductor chip and the lead is hermetically sealed and fixed by the molded base, there is no need to provide the conventional frame for fixing the semiconductor chip, thereby reducing the total heat capacity. This eliminates errors caused by heat leakage and enhances the rapid response to change in flow rate. Since the junction is hermetically sealed, connecting wires and the like are not exposed to a fluid to be measured. The junction is not damaged at a large fluid flow.

The present invention is also intended for a method of fabricating a semiconductor sensor device. According to the present invention, the method comprises the steps of: (a) forming a sensor element and a connecting terminal to be connected to the sensor element on a surface of a semiconductor substrate; (b) forming a first resin wall around the sensor element on the surface of the semiconductor substrate and a second resin wall in corresponding position to the first resin wall on an opposite face of the semiconductor substrate; (c) cutting the semiconductor substrate to form a semiconductor chip; (d) connecting a lead to the connecting terminal of the semiconductor chip; and (e) molding a base covering only a junction between the connecting terminal and the lead with the sensor element exposed.

In the method according to the invention, the resin wall is formed around the sensor element and the base is molded. This prevents the sensor element from being contaminated with the mold resin. The semiconductor sensor device having the foregoing excellent performance is fabricated efficiently in the fabrication line.

It is an object of the present invention to provide a semiconductor sensor device which has a higher accuracy of flow rate detection with a simple structure, a rapid response to change in flow rate, and high detection reliability at a large flow rate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
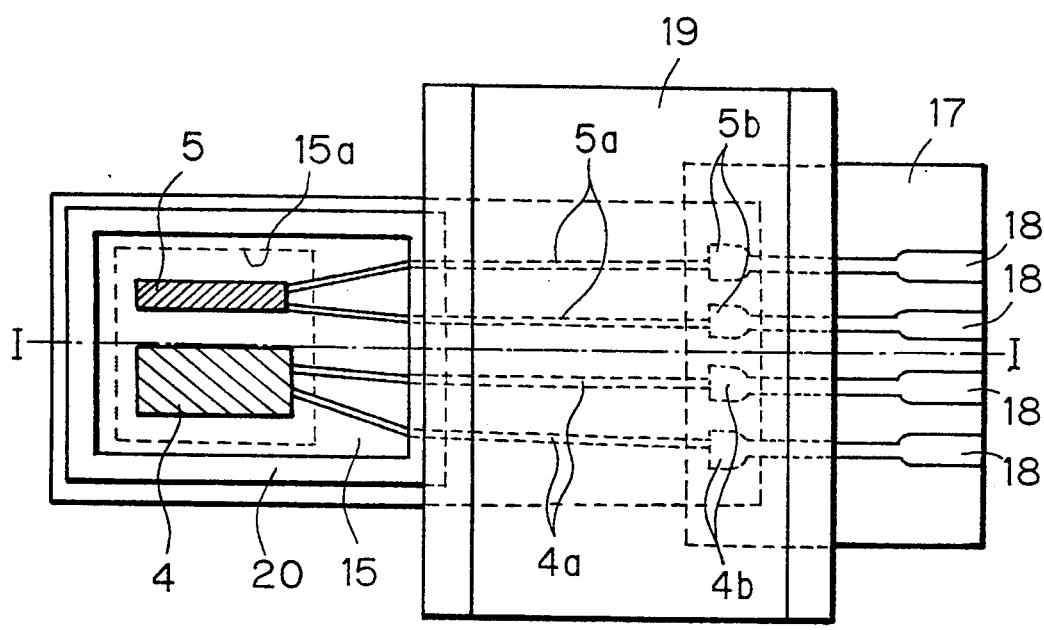
FIGS. 1A and 1B show a semiconductor flow rate detector according to a first preferred embodiment of the present invention.

Referring now to the drawings, description will be given in detail on a semiconductor flow rate detector as a preferred embodiment of semiconductor sensor devices according to the present invention. The technical scope of the present invention is not limited by the description.

Figure 1B:
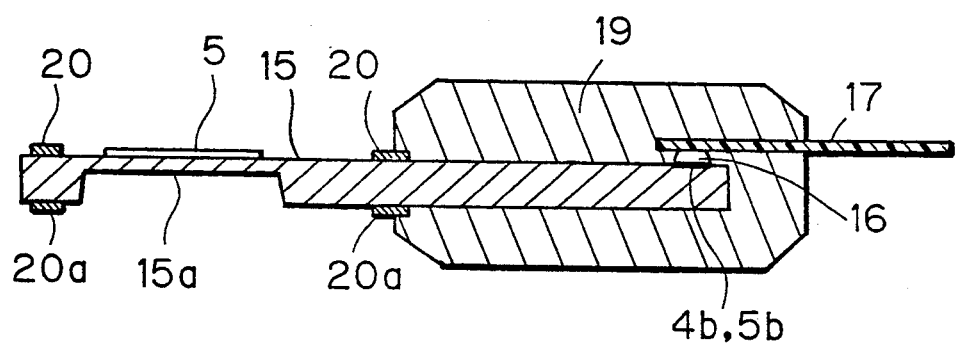

FIG. 1A is a plan view of the semiconductor flow rate detector according to a first preferred embodiment of the present invention. FIG. 1B is a vertical sectional view taken along the line I—I of FIG. 1A.

Figure 8A:
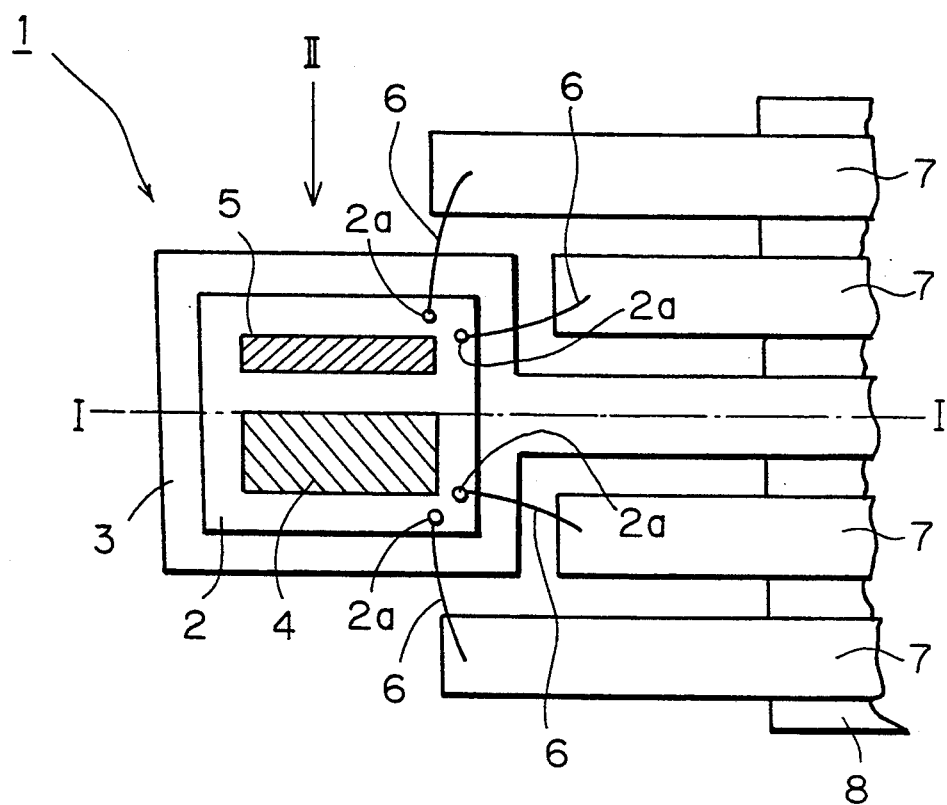
FIGS. 8A and 8B show a conventional semiconductor flow rate detector.
Figure 8B:
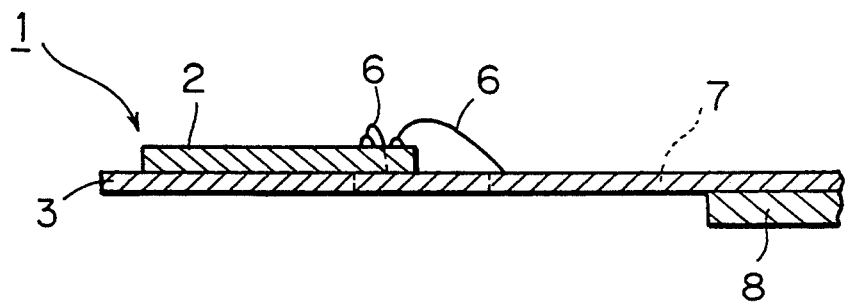
Figure 9:
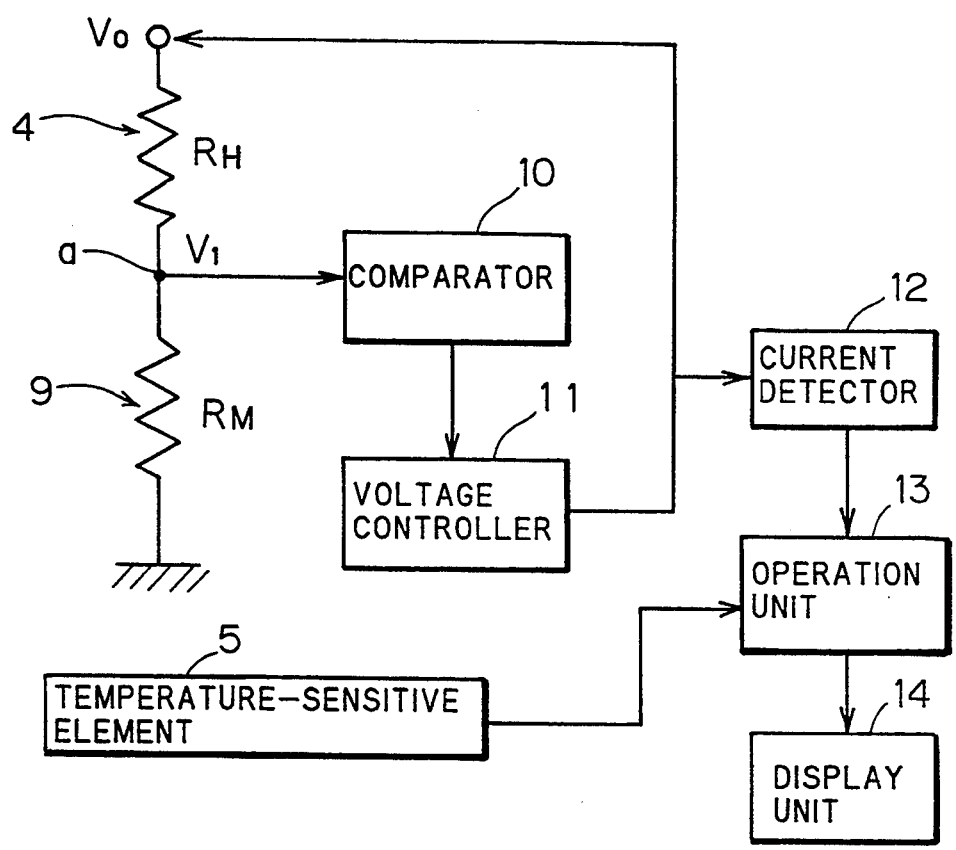
FIG. 9 shows an example of flow rate detection circuits by means of the conventional semiconductor flow rate detector.

The same reference characters as in FIGS. 8A and 8B designate identical parts in FIGS. 1A and 1B, and the description thereof will be omitted.

A semiconductor chip 15 includes a thin film portion 15a. A heater element 4 and a temperature-sensitive element 5 are formed on the surface of the thin film portion 15a. The provision of the thin film portion 15a affords reduction in heat capacity of a sensor portion as well as expectant heat exchange from the back side. Therefore, extremely rapid responses to change in flow rate are achieved.

Output terminals 4a and 5a of the elements 4 and 5 are patterned on the surface of the semiconductor chip 15, and are connected to leads 18 of a flexible lead 17 through metal bumps 16 made of gold and the like at connecting terminals 4b and 5b on the opposite end of the semiconductor chip 15.

Figure 2:
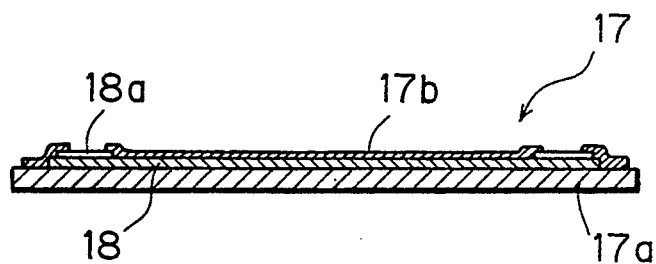
FIG. 2 is a vertical sectional view of a flexible lead according to the first preferred embodiment.

The flexible lead 17 includes, as shown in FIG. 2, a resin sheet 17a such as polyimide, the leads 18 of copper pattern formed on the resin sheet 17a, and a resin film 17b coating the top surface for protection. Only junctions of the leads 18 are exposed on the surface. The exposed portions, in which gold thin films are evaporated, are adapted to constantly keep excellent electrical contact.

A base 19 is formed by molding epoxy resin as described below so that it covers a junction between the semiconductor chip 15 and flexible lead 17. The base 19 hermetically seals the junction and integrally holds the semiconductor chip 15 and flexible lead 17.

A resin wall 20 is formed on the surface of the semiconductor chip 15 such that it surrounds the sensor portion formed by the heater and temperature-sensitive elements 4 and 5. A resin wall 20a is formed on the opposite face of the semiconductor chip 15 in symmetrical relation to the resin wall 20.

The resin walls 20 and 20a prevent the resin from entering and contaminating the sensor portion during the molding of the base 19.

Figure 3:
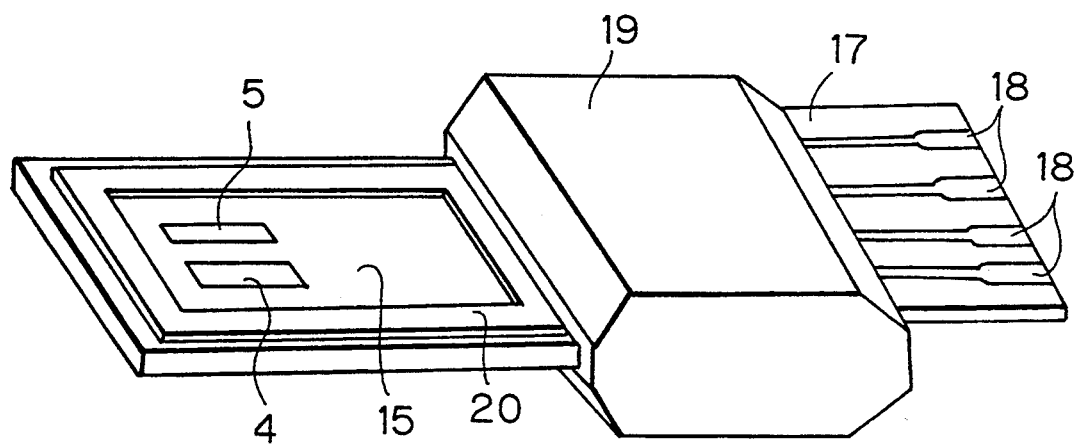
FIG. 3 is a perspective view of the whole semiconductor flow rate detector according to the first preferred embodiment.

FIG. 3 is a perspective view of the whole semiconductor flow rate detector of the first preferred embodiment. The semiconductor flow rate detector is installed such that the sensor portion on the left side of the base 19 is inserted into a tube which forms a fluid passageway. A lead portion on the right side of the base 19 is located outside the tube and is connected to a circuit similar to the conventional flow rate detection circuit for detecting the flow rate of the fluid flowing in the tube.

Description will be given on a method of fabricating the semiconductor flow rate detector according to the first preferred embodiment, with reference to FIGS. 4A to 4D, 5A to 5C, 6A and 6B.

Figure 4A:
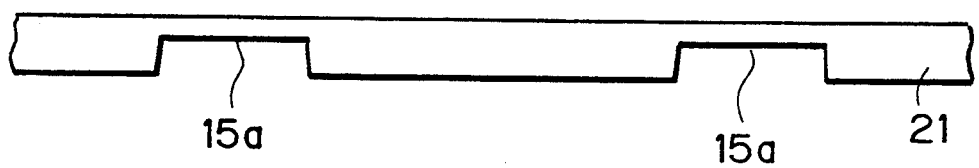
FIGS. 4A to 4D show the steps of forming resin walls of the semiconductor flow rate detector according to the first preferred embodiment.

The thin film portions 15a are formed in predetermined positions in a silicon wafer 21, as shown in FIG. 4A. The heater and temperature-sensitive elements are formed on the top surface of the thin film portions 15a to form the sensor portions. (The heater and temperature-sensitive elements are not shown herein for convenience of illustration.)

Figure 4B:
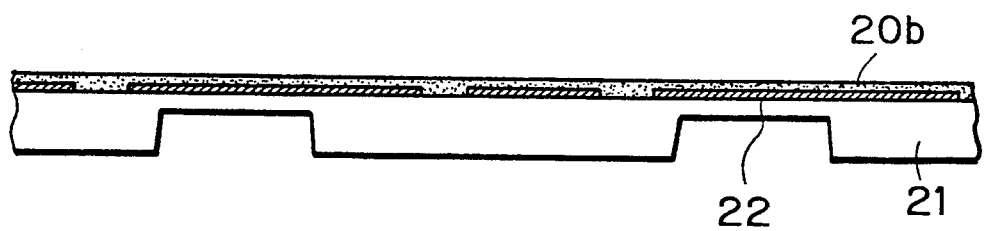

A thin metal mask 22 is disposed on the top surface of the silicon wafer 21 so that the metal mask 22 covers the sensor portions. Silicon resin 20b is uniformly applied to the top surface with a brush or printed thereon, as shown in FIG. 4B. When only the metal mask 22 is removed, the silicon resin 20b remains only in regions where the metal mask 22 has not been applied and adheres to the surface of the silicon wafer 21, so that the resin walls 20 are formed as shown in FIG. 4C.

The silicon wafer 21 is turned upside down, and the resin walls 20a are formed on the opposite face of the silicon wafer 21 in symmetrical relation to the resin walls 20 in the similar steps. The silicon wafer 21 is cut to length, whereby the semiconductor chip 15 is formed as shown in FIG. 4D.

Figure 4C:
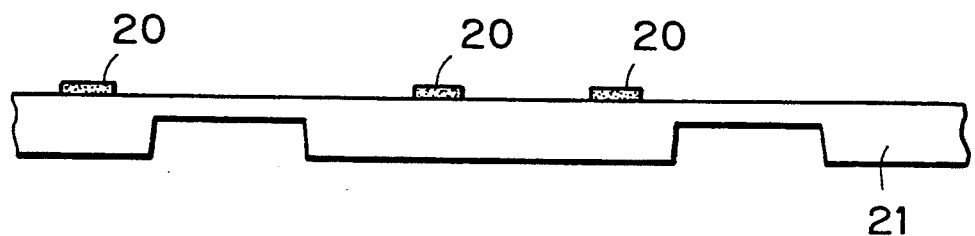
Figure 4D:
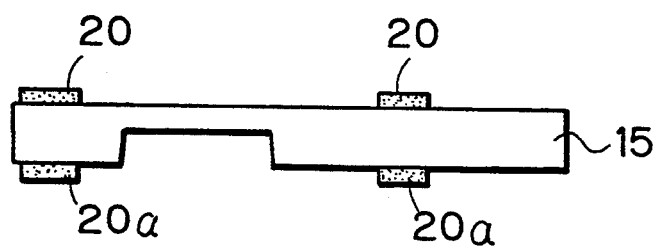

Although the resin walls 20 and 20a appear to be considerably thick in the schematic illustration of FIGS. 4C and 4D, the resin walls 20 and 20a are, in practice, about tens of microns in thickness. This does not significantly change the heat capacity of the sensor portion of the semiconductor chip 15.

Figure 5A:
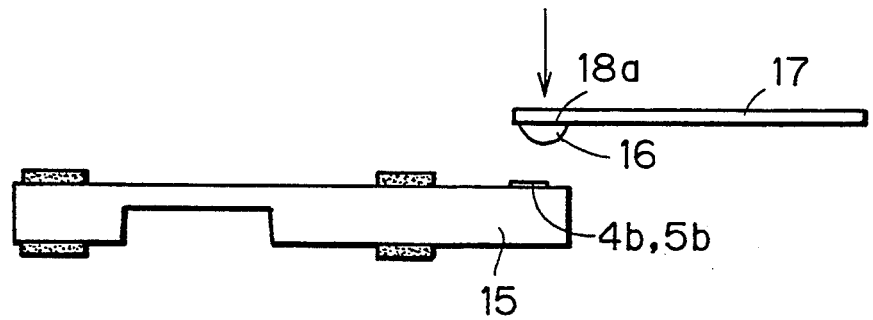
FIGS. 5A to 5C show processes for joining a semiconductor chip and the flexible lead together in the semiconductor flow rate detector according to the first preferred embodiment.

Next, the flexible lead 17 is joined to the semiconductor chip 15 in the steps described below. The gold bumps 16 are previously deposited on the flexible lead 17 at the junctions 18a, as shown in FIG. 5A. The junctions 18a are matched to the connecting terminals 4b and 5b of the semiconductor chip 15. The gold bumps 16 are alloyed with the metals of the connecting terminals 4b and 5b (for example aluminum) under heat and pressure to join the flexible lead 17 and semiconductor chip 15 together.

Figure 5B:
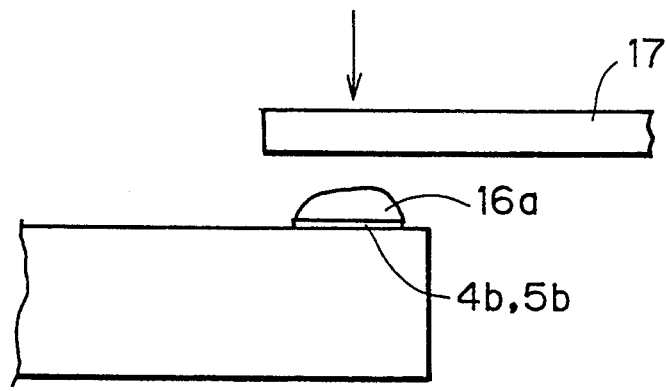
Figure 5C:
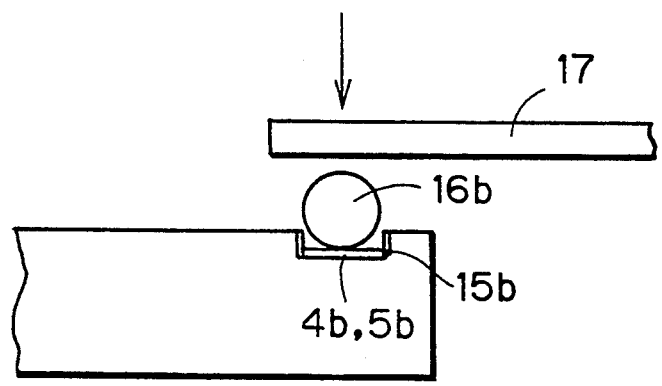

Another process may be performed in which gold bumps 16a are previously deposited on the connecting terminals 4b and 5b of the semiconductor chip 15, as shown in FIG. 5B. In still another process shown in FIG. 5C, each of the connecting terminals 4b and 5b of the semiconductor chip 15 may be formed with a recess 15b, in which a ball-like gold bump 16b is placed, and heat and pressure are applied to the flexible lead 17 from above the gold bump 16b.

The flexible lead 17 is formed by suitably cutting a tab-like flexible lead having a plurality of leads 18 arranged laterally. Cutting after the joining step in the fabrication steps provides for a better working efficiency in a fabrication line.

Figure 6A:
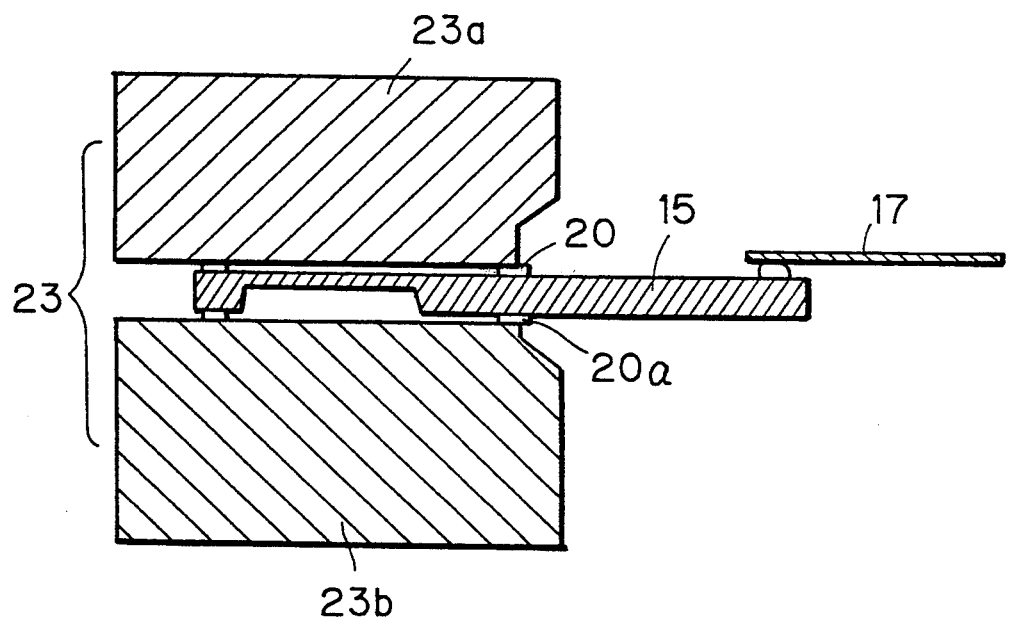
FIGS. 6A and 6B show the steps of molding a base of the semiconductor flow rate detector according to the first preferred embodiment.
Figure 6B:
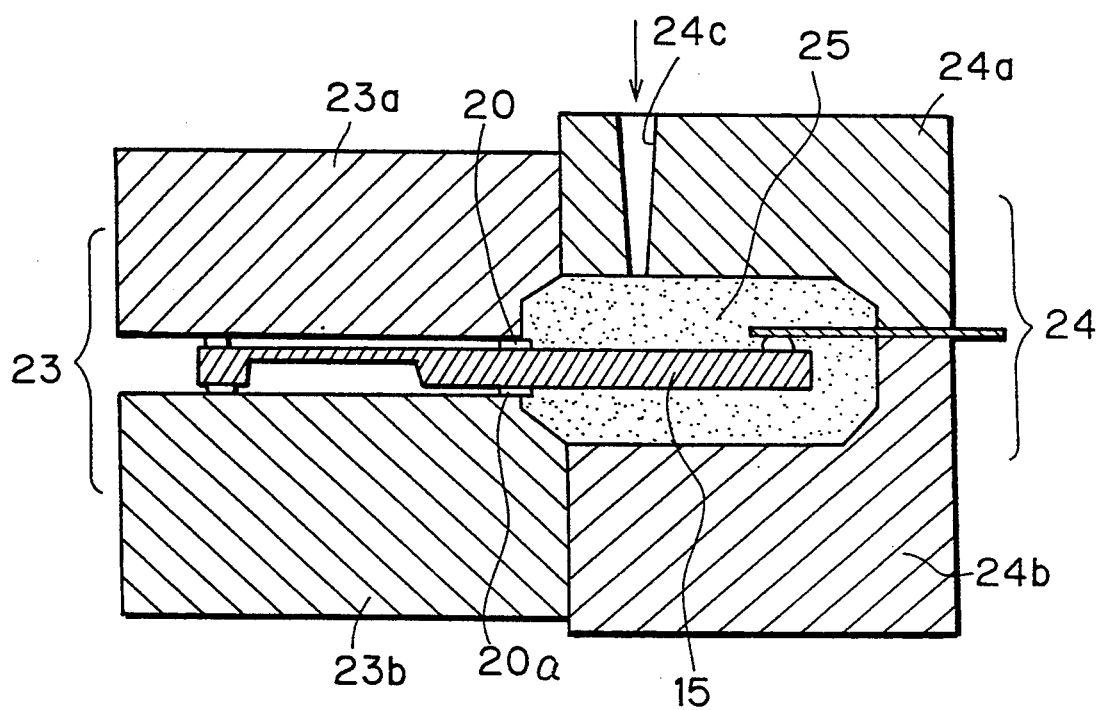

With reference to FIGS. 6A and 6B, discussed is the step of mounting the resin base 19 to the semiconductor chip 15 to which the flexible lead 17 is connected.

The sensor portion of the semiconductor chip 15 is caught in a die 23, between upper and lower dies 23a and 23b, and is fixed, as shown in FIG. 6A.

The junction between the semiconductor chip 15 and the flexible lead 17 is enclosed and clamped by a mold 24 composed of upper and lower molds 24a and 24b. Melted epoxy mold resin 25 is poured into the mold 24 from a resin pouring gate 24c formed in the upper mold 24a, as shown in FIG. 6B.

It is apparent from FIG. 6B that the mold resin 25 leaks little from a side face of the mold 24, which is in close contact with a side face of the die 23. Since the upper and lower dies 23a and 23b hold the semiconductor chip 15 therebetween through the resin walls 20 and 20a, the resin walls 20 and 20a serving as a shield prevent the mold resin 25 from flowing into the sensor portion of the semiconductor chip 15. When the mold resin 25 leaks from the side of the shield portion, the resin walls 20 and 20a which enclose the sensor portion prevent the mold resin 25 from entering the sensor portion. The sensor portion of the semiconductor chip 15 is not contaminated with the mold resin 25, maintaining a stable detection accuracy.

When the temperature of the poured mold resin 25 falls until the mold resin 25 is solidified, the mold 24 and die 23 are detached, and unnecessary burrs are removed. The semiconductor flow rate detector shown in FIG. 3 is finally accomplished.

The lower die 23b and lower mold 24b are separate in the first preferred embodiment, however, may be integrated.

The entire operations of the die 23 which holds the semiconductor chip 15 and the mold 24 which clamps the semiconductor chip 15 are automated by means of a well-known hydraulic actuator apparatus (not shown) and the like.

Figure 7:
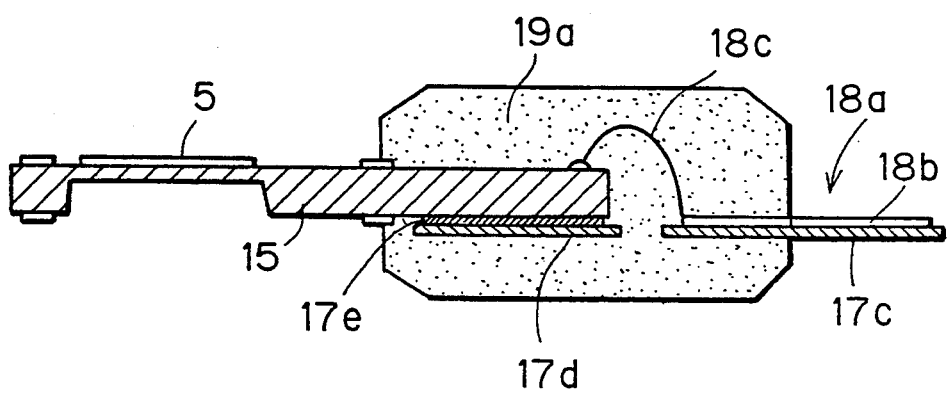
FIG. 7 shows the semiconductor flow rate detector according to a second preferred embodiment of the present invention.

The leads 18 are flexible leads in the first preferred embodiment. However, normal hard leads 18b may be employed as shown in FIG. 7 according to a second preferred embodiment of the present invention.

The joining step in the second preferred embodiment is described below. A metal lead frame 17c for holding the leads 18b and a die support pad lid are integrally formed. The die support pad 17d is securely bonded to the bottom surface of the junction of the semiconductor chip 15 with a die bonding material lie. Wires 18c connect leads 18b on the lead frame 17c to the connecting terminals of the elements of the semiconductor chip 15 by means of wiring bonding.

The lead frame 17c is separated from the die support pad 17d. A resin base 19a for covering the wiring bonding portion is formed by molding in the same technique as in the first preferred embodiment.

The heater element 4 in the preferred embodiments may be resistor, transistor and the like. The heater element 4 itself need not have a temperature coefficient. For example, another temperature-sensitive element may be provided adjacent to the heater element 4 as disclosed in Japanese Patent Application Laid-Open No. 60-1525. The temperature-sensitive element detects the temperature of the heater element 4 and performs a feedback control such that the temperature remains constant. The flow rate may be measured by detecting variation in current flowing to the heater element 4.

The semiconductor flow rate detector is discussed as an example of the semiconductor sensor devices in the preferred embodiments. The present invention, however, is not limited to the semiconductor flow rate detector, and is applicable to various semiconductor sensor devices such as odor and humidity sensor devices.

While the invention has been shown and described in detail, the foregoing description is in all aspects illustrative and not restrictive. It is therefore to be understood that numerous modifications and variations can be devised without departing from the scope of the invention.

What is claimed is:

1. A semiconductor sensor device, comprising:
a semiconductor chip including on its surface a sensor element and a connecting terminal connected to said sensor element;
a lead connected to said connecting terminal; and
a base for covering only a junction between said connecting terminal and said lead with said sensor element exposed and integrally holding said semiconductor chip and said lead, wherein said semiconductor chip further includes a first resin wall formed around said sensor element on said surface of said semiconductor chip and a second resin wall formed in a position on an opposite face of said semiconductor chip which corresponds to the position of said first resin wall with respect to said surface of said semiconductor chip.

2. A semiconductor sensor device in accordance with claim 1, wherein said sensor element includes a flow rate sensor element.

3. A semiconductor sensor device in accordance with claim 2, wherein said flow rate sensor element includes a heater element and a temperature-sensitive element.

4. A semiconductor sensor device in accordance with claim 1, wherein said first and second resin walls comprise silicon resin.

5. A semiconductor sensor device in accordance with claim 1, wherein said lead includes a hard lead, said hard lead being joined to said connecting terminal of said semiconductor chip by means of wire bonding.

6. A semiconductor sensor device in accordance with claim 1, wherein said base is formed of mold resin.

7. A semiconductor sensor device in accordance with claim 1, wherein said lead includes a flexible lead.

8. A semiconductor sensor device in accordance with claim 7, wherein a connection between said flexible lead and said connecting terminal of said semiconductor chip comprises a metal bump therebetween at said junction.

9. A semiconductor sensor device in accordance with claim 1, wherein said semiconductor chip comprises a thin film portion, said sensor element being formed on said thin film portion.

* * * * *